United States Patent [19]

Proskow

[11] 4,177,074
[45] Dec. 4, 1979

[54] BUTADIENE/ACRYLONITRILE PHOTOSENSITIVE, ELASTOMERIC POLYMER COMPOSITIONS FOR FLEXOGRAPHIC PRINTING PLATES

[75] Inventor: Stephen Proskow, Wilmington, Del.

[73] Assignee: E. I. Du Pont de Nemours and Company, Wilmington, Del.

[21] Appl. No.: 872,082

[22] Filed: Jan. 25, 1978

[51] Int. Cl.$^2$ .............................................. G03G 1/68
[52] U.S. Cl. ................................... 430/286; 430/905; 430/916; 430/288
[58] Field of Search ................ 96/115 P, 35.1, 115 R; 526/342; 260/82.3

[56] References Cited

U.S. PATENT DOCUMENTS 3,787,212  1/1974  Heimsch et al. ...................... 96/35.1

FOREIGN PATENT DOCUMENTS 51-106501  9/1976  Japan .

Primary Examiner—John D. Welsh

[57] ABSTRACT

Photosensitive, elastomeric compositions containing
(1) a high molecular weight butadiene/acrylonitrile copolymer,
(2) a low molecular weight butadiene polymer,
(3) an ethylenically unsaturated monomer, and
(4) a free-radical generating system have outstanding properties as photosensitive coatings for flexographic printing plates. When the combination of high and low molecular weight polymers contains at least about 2% by weight of carboxyl groups, the compositions are processable in aqueous or semiaqueous basic solutions.

18 Claims, No Drawings

BUTADIENE/ACRYLONITRILE PHOTOSENSITIVE, ELASTOMERIC POLYMER COMPOSITIONS FOR FLEXOGRAPHIC PRINTING PLATES

BACKGROUND OF THE INVENTION

1. Field of the Invention

This invention relates to photosensitive compositions comprising a high molecular weight butadiene/acrylonitrile copolymer and a low molecular weight butadiene polymer, and the use of such compositions as the photosensitive element in flexographic printing plates.

2. Description of the Prior Art

Butadiene/acrylonitrile copolymer binders have been employed previously in photosensitive compositions. U.S. Pat. No. 3,825,430 to Kurka describes a light-sensitive composition containing a continuous phase of a light-sensitive organic material and a discontinuous phase of a finely divided, elastomeric organic compound uniformly distributed through the continuous phase, e.g., a carboxyl-containing, high molecular weight butadiene/acrylonitrile copolymer. The discontinuous phase generally represents 5–50% by weight of the total composition.

Canadian Pat. No. 614,181 to McGraw describes a photopolymerizable composition at least 40% by weight of a butadiene homopolymer or copolymer binder including butadiene/acrylonitrile and butadiene/methacrylic acid copolymers, at least 10% by weight of an addition-polymerizable ethylenically unsaturated compound and 0.001 to 10% by weight of a polymerization initiator.

British Pat. No. 1,358,062 to Uniroyal, Inc. also teaches photosensitive compositions containing at least 40% by weight of a nitrile rubber including butadiene/acrylonitrile copolymers, at least 5% by weight of an addition-polymerizable ethylenically unsaturated compound, and 0.1 to 10% by weight of a polymerization initiator.

British Pat. No. 1,395,822 to Uniroyal, Inc. teaches photopolymerizable compositions comprising at least 40% by weight of an elastomeric monovinylarene/diene block copolymer, at least 5% by weight of a polyethylenically unsaturated ester, and 0.1 to 10% by weight of a polymerization initiator. Optionally, the composition may contain up to 50% by weight of a liquid rubber having a molecular weight of 750 to 3000, for example, butadiene homopolymers or copolymers with acrylonitrile.

SUMMARY OF THE INVENTION

The present invention comprises a photosensitive, elastomeric composition which comprises, based on the total composition, (1) about 55 to about 85% by weight of a high molecular weight butadiene/acrylonitrile copolymer having a number average molecular weight of about 20,000 to about 75,000, an acrylonitrile content of about 10 to about 50% by weight, and a carboxyl content of 0 to about 15% by weight;

(2) about 5 to about 40% by weight of a low molecular weight butadiene polymer having a number average molecular weight of about 750 to about 10,000, an acrylonitrile content of 0 to about 50% by weight, and a carboxyl content of 0 to about 15% by weight;

(3) about 2 to about 40% by weight of a nongaseous, ethylenically unsaturated compound containing at least one terminal ethylenic group, said compound being capable of forming a high polymer by free-radical initiated, chain-propagating addition polymerization and being compatible with polymers (1) and (2);

(4) about 0.001 to about 10% by weight of an organic, radiation-sensitive, free-radical generating system, activatible by actinic radiation, which initiates polymerization of the unsaturated compound.

The photosensitive, elastomeric compositions of this invention differ from similar photosensitive, elastomeric compositions of the prior art in that they contain a mixture of a high molecular weight butadiene/acrylonitrile copolymer and a low molecular weight butadiene polymer as the binder component. Such compositions are readily prepared and processed into useful elements comprising a substrate bearing a layer of the photosensitive composition. Furthermore, when elements of this invention are imagewise exposed to actinic radiation, the exposed areas become insoluble and result in tough, shaped, elastomeric reliefs upon subsequent solvent removal of unexposed portions of the composition.

In addition, when the combination of the high and low molecular weight copolymers contains at least about 2% by weight of carboxyl groups, the photosensitive compositions are soluble in aqueous or semiaqueous basic solutions before photopolymerization. Such photosensitive elements can be exposed and developed by washing with aqueous or aqueous/organic basic solutions to produce a photoimage. Use of such aqueous basic developing solutions avoids the use of organic solvents which are costly and present fire, health and ecological hazards.

This invention provides photosensitive elements for producing flexographic printing plates of uniform printing height from relatively inexpensive materials and with a marked reduction in labor requirements over the conventional procedure. Both the relief and printed images obtained show fidelity to the original transparency both in small detail and in overall dimensions even when the element is imagewise exposed on a cylindrical support. The reliefs have high impact strength, are tough and abrasion-resistant, and have broad ink compatibility, i.e., have good compatibility with a wide range of inks, e.g., water-based inks, hydrocarbon inks and alcohol-based inks. The hardness of the reliefs and the ease of development can be easily changed by varying components and component concentrations.

DETAILED DESCRIPTION OF THE INVENTION

One of the essential ingredients in the compositions of this invention is a high molecular weight butadiene/acrylonitrile copolymer having a number average molecular weight in the range of about 20,000 to about 75,000, and preferably in the range of about 25,000 to about 50,000. The acrylonitrile content of these polymers varies from about 10 to about 50% by weight, and preferably from about 15 to about 40%. Optionally, the copolymer also has a carboxyl content of 0 to about 15% by weight. When the copolymer contains carboxyl groups, the carboxyl content is preferably in the range of about 1 to about 15%, and most preferably in the range of about 2 to about 10%. The high molecular weight copolymer should be present in the amount of about 55 to about 85% by weight, based on the total composition, and preferably about 60 to about 75%. At least about 55% by weight of the high molecular weight copolymer is necessary to give adequate flexibility and physical integrity to photosensitive elements, particularly for flexographic plates.

Another essential ingredient in the compositions of this invention is a low molecular weight butadiene polymer having a number average molecular weight in the range of about 750 to about 10,000, and preferably in the range of about 1,000 to about 5,000. Optionally, the polymer has an acrylonitrile content of from 0 to about 50% by weight. When the polymer contains acrylonitrile groups, the acrylonitrile content is preferably in the range of about 10 to about 30%. Optionally, the polymer also has a carboxyl content of 0 to about 15% by weight. When the copolymer contains carboxyl groups, the carboxyl content is preferably in the range of about 1 to about 15%, and most preferably in the range of about 2 to about 10%.

The presence of the low molecular weight butadiene polymer in the photosensitive compositions of this invention improves the mixing and handling and the rate of development of the composition. The presence of this component also provides softer and more flexible compositions. The low molecular weight polymer should be present in the amount of about 5 to about 40% by weight, based on the total composition and preferably about 10 to about 35%.

Carboxyl groups may be incorporated into the high molecular weight copolymer or the low molecular weight polymer by addition to the polymerization process of a carboxyl-containing termonomer, e.g., methacrylic acid, or a termonomer which is convertible to a carboxyl-containing group, e.g., maleic anhydride or methyl methacrylate. Such polymers are available commercially from several sources, e.g., from the B. F. Goodrich Chemical Company under the trade name Hycar ®.

The carboxyl contents of these polymers are calculated from the equivalents of carboxyl groups per hundred parts of rubber (EPHR) times the molecular weight of the carboxyl group (45) in accordance with the equation:

% carboxyl = EPHR × 45

Another essential ingredient of the photosensitive compositions of this invention is a nongaseous, ethylenically unsaturated compound containing at least one terminal ethylenic group. This compound should be capable of forming a high polymer by free-radical initiated chain-propagating addition polymerization and be compatible with the high and low molecular weight polymers. One class of suitable ethylenically unsaturated compounds includes unsaturated esters of alcohols, especially such esters of alpha-methylene carboxylic acids and substitited alpha-methylene carboxylic acids, more especially such esters of alkylene polyols and polyalkylene polyols, and most especially alkylene polyol di- and tri-acrylates and polyalkylene polyol di- and tri-acrylates prepared from alkylene polyols of 2–15 carbon atoms or polyalkylene ether polyols or glycols of 1–10 ether linkages.

The following specific compounds are further illustrative of this class: ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol triacrylate, pentaerythritol tetramethacrylate, 1,3-propanediol diacrylate, 1,3-pentanediol dimethacrylate, p-α,α-dimethylbenzylphenyl acrylate, t-butyl acrylate, N,N-diethylaminoethyl acrylate, diethylaminoethyl methacrylate, 1,4-butanediol diacrylate, hexamethylene glycol diacrylate, decamethylene glycol diacrylate, 2,2-dimethylolpropane diacrylate, tripropylene glycol diacrylate, 2,2-di(p-hydroxy-phenyl)propane diacrylate, 2,2-di(p-hydroxyphenyl)propane dimethacrylate, polyoxyethyl-2,2-di(p-hydroxyphenyl)propane dimethacrylate, polyoxypropyltrimethylolpropane triacrylate (molecular weight of 462), 1,4-butanediol dimethacrylate, hexamethylene glycol dimethacrylate, 2,2,4-trimethyl-1,3-pentanediol dimethacrylate, 1-phenylethylene-1,2-dimethacrylate, trimethylolpropane trimethacrylate, triethylene glycol diacrylate, ethylene glycol acrylate phthalate, polyoxyethyltrimethylolpropane triacrylate, diacrylate and dimethacrylate esters of diepoxy polyethers derived from aromatic polyhydroxy compounds such as bisphenols, novolaks and similar compounds such as those described by Crary in U.S. Pat. No. 3,661,576, the bis-acrylates and methacrylates of polyethylene glycols of molecular weight 200–500, and the like.

Another class of suitable ethylenically unsaturated compounds includes the compounds disclosed by Martin and Barney in U.S. Pat. No. 2,927,022, e.g., those having a plurality of addition polymerizable ethylenic linkages, particularly when present as terminal linkages, and especially those wherein at least one and preferably most of such linkages are conjugated with a double bonded carbon, including carbon doubly bonded to carbon and to heteroatoms such as nitrogen, oxygen and sulfur. Preferred are such materials wherein the ethylenically unsaturated groups, especially the vinylidene groups, are conjugated with ester or amide structures. Specific examples of such compounds include unsaturated amides, particularly those of alpha-methylene carboxylic acids, especially with alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis(γ-methacrylamidopropoxy)ethane, betamethacrylamidoethyl methacrylate, N-(beta-hydroxyethyl)-beta-(methacrylamido)ethyl acrylate, and N,N-bis(beta-methacryloxyethyl) acrylamide; vinyl esters such aas divinyl succinate, divinyl adipate, divinyl phthalate, divinyl terephthalate, divinyl benzene-1,3-disulfonate, and divinyl butane-1,4-disulfonate; diallyl fumarate; and the like.

Additional ethylenically unsaturated compounds which may be used include styrene and derivatives thereof, 1,4-diisopropenylbenzene, 1,3,5-triisopropenylbenzene; itaconic anhydride adducts with hydroxyethyl acrylate (1:1), itaconic anhydride adducts with liquid butadiene/acrylonitrile polymers containing terminal amino groups, and itaconic anhydride adducts with the diacrylate and dimethacrylate esters of diepoxy polyethers described by Crary in U.S. Pat. No. 3,661,576; polybutadiene and butadiene/acrylonitrile copolymers containing terminal and pendant vinyl groups; and unsaturated aldehydes, such as sorbaldehyde (2,4-hexadienal).

Ethylenically unsaturated compounds which are water soluble or contain carboxyl or other alkali-reactive groups are especially suitable when aqueous basicdevelopable systems are involved. In addition, the polymerizable, ethylenically unsaturated polymers of Burg, U.S. Pat. No. 3,043,805; Martin, U.S. Pat. No. 2,929,710; and similar materials may be used alone or mixed with other materials. Acrylic and methacrylic esters of adducts of ethylene oxide and polyhydroxy compounds such as those described by Cohen and Schoenthaler in U.S. Pat. No. 3,380,831 are also useful. The photocross-linkable polymers disclosed in Schoenthaler, U.S. Pat. No. 3,418,295, and Celeste, U.S. Pat. No. 3,448,089, may also be used.

The amount of unsaturated compound added should be in the range of about 2 to about 40% by weight, based on the total composition. The specific amount for optimum results will vary depending on the particular polymers used. Preferably the amount of unsaturated compound is in the range of about 5 to about 25%.

The ethylenically unsaturated compound preferably has a boiling point at normal pressure of over about 100° C. The most preferred ethylenically unsaturated compounds are triethylene glycol diacrylate, triethylene glycol dimethacrylate, hexamethylene glycol dimethacrylate and hexamethylene glycol diacrylate.

The photosensitive compositions of this invention essentially do not scatter actinic radiation when in the form of thin layers, e.g., less than about 250 mils (0.635cm). In order to secure an essentially transparent mixture, i.e., a nonradiation-scattering mixture, the butadiene copolymer and polymer components should be compatible with, and preferably soluble in, the ethylenically unsaturated compound in the proportions used.

By "compatible" is meant the ability of two or more constituents to remain dispersed in one another without causing any significant amount of scattering of actinic radiation. Compatibility if often limited by the relative proportions of the constituents and incompatibility is evidenced by formation of haze in the photosensitive composition. Some slight haze can be tolerated from such compositions before or during exposure in the preparation of printing reliefs, but when fine detail is desired, haze should be completely avoided. The amount of ethylenically unsaturated compound, or any other constituent, used is therefore limited to those concentrations which do not produce undesired light scatter or haze.

Another essential ingredient of the photosensitive compositions of this invention is an organic, radiation-sensitive, free-radical generating system. Practically any organic, radiation-sensitive, free-radical generating system which initiates polymerization of the unsaturated compound and does not excessively terminate the polymerization can be used in the photosensitive compositions of this invention. The term "organic" is used here and in the claims to designate compounds which contain carbon, and one or more of oxygen, hydrogen, nitrogen, sulfur and halogen, but no metal. Because process transparencies transmit heat originating from conventional sources of actinic radiation, and since the photosensitive compositions are usually prepared under conditions resulting in elevated temperatures, the preferred free-radical generating compounds are inactive thermally below 85° C., and more preferably below 185° C. They should be dispersible in the composition to the extent necessary for initiating the desired polymerization or cross-linking under the influence of the amount of radiation absorbed in relatively short term exposures. These initiators are useful in amounts from about 0.001 to about 10% by weight, and preferably from about 0.1 to about 5% based on the total weight of the solvent-free photosensitive composition.

The free-radical generating system absorbs radiation within the range of about 2000 to about 8000 Å and has at least one component that has an active radiatin absorption band with molar extinction coefficient of at least about 50 within the range of about 2500 to about 8000 Å, and preferably about 2500 to about 5000 Å. The term "active radiation absorption band" means a band of radiation which is active to produce the free radicals necessary to initiate polymerization or cross-linking of the unsaturated material.

The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such free-radical generating compounds can be utilized in the practice of the invention and include aromatic ketones such as benzophenone, Michler's ketone [4,4'-bis(dimethylamino)benzophenone], 4,4'-bis(diethylamine)benzophenone, 4-acryloxy-4'-dimethylaminobenzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzathraquinone, 2,3-dichloronaphthoquinone, benzil dimethyl acetal, and other aromatic ketones; benzoin, benzoin ethers such as benzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like as disclosed in U.S. Pat. Nos. 3,479,185 and 3,784,557 and in British Pat. Nos. 997,396 and 1,047,569.

The imidazolyl dimers are used with a free-radical producing electron donor such as 2-mercaptobenzoxazole, Leuco Crystal Violet or tris(4-diethylamino-2-methylphenyl)methane. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863. Preferred as free-radical generating systems are the benzoin ethers, particularly benzoin isobutyl ether, and benzil dimethyl acetal.

The photosensitive compositions may also contain a small amount of thermal, addition polymerization inhibitor, e.g., 0.001% to 2.0%, based on the weight of the total solvent-free photosensitive composition. Suitable inhibitors include hydroquinone and alkyl and aryl-substituted hydroquinones, 2,6-di-tert-butyl-4-methylphenol, p-methoxyphenol, tert-butylpyrocatechol, pyrogallol, beta-naphthol, 2,6-di-tert-butyl-p-cresol, phenothiazine, pyridine, nitrobenzene, dinitrobenzene and the nitroso dimer inhibitor systems described in British Pat. No. 1,453,681. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized or photocross-linked without removal of the inhibitor. The preferred inhibitors are 2,6-di-tert-butyl-4-methylphenol and p-methoxyphenol.

The oxygen and ozone resistance of photosensitive elements of this invention and printing reliefs made therefrom can be improved by incorporating into the photosensitive composition a suitable amount of compatible well known antioxidants and/or antiozonants. Antioxidants useful in this invention include: alkylated phenols, e.g., 2,6-di-tert-butyl-4-methylphenol; alkylated bis-phenols, e.g., 2,2-methylene-bis-(4-methyl-6-tert-butylphenol); 1,3,5-trimethyl-2,4,6-tris-(3,5-di-tert-butyl-4-hydroxybenzyl)benzene; 2-(4-hydroxy-3,5-di-tert-butylanilino)-4,6-bis-(n-octylthio)-1,3,5-triazine; polymerized trimethyldihydroquinone; and dilauryl thiopropionate.

Antiozonants useful in this invention include: microcrystalline wax and paraffin wax; dibutylthiourea; 1,1,3,3-tetramethyl-2-thiourea; Antiozonant AFD, a product of Nafton Co.; norbornenes, e.g., di-5-norbornene-2-methyl adipate, di-5-norbornene-2-methyl maleate, di-5-norbornene-2-methyl terephthalate; Ozone Protector 80, a product of Reichhold Chemical Co.; N-phenyl-2-naphthylamine; unsaturated vegetable oils, e.g., rapeseed oil, linseed oil, safflower oil; polymers and resins, e.g., ethylene/vinyl acetate copolymer resin, chlorinated polyethylene, chlorosulfonated polyethylene, chlorinated ethylene/methacrylic acid copolymer, polyurethanes, polypentadienes, polybutadiene, furfural-derived resins, ethylene/propylene/diene rubber, diethylene glycol ester of rosin and α-methylstyrene/vinyltoluene copolymer. Ozone resistance of the printing relief produced can also be improved by annealing it at elevated temperatures prior to use.

If desired, the photosensitive compositions can also contain immiscible, polymeric or nonpolymeric organic or inorganic fillers or reinforcing agents which are essentially transparent at the wavelengths used for exposure of the photosensitive material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

The photosensitive layer may also, if desired, include compatible plasticizers to lower the glass transition temperature of the binder and facilitate selective development. The plasticizer may be any of the common plasticizers compatible with the polymeric binders. Among the common plasticizers are dialkyl phthalates, alkyl phosphates, polyethylene glycol, polyethylene glycol esters, and polyethylene glycol ethers.

The photosensitive compositions of this invention can be prepared in any suitable way by mixing the four essential constituents, i.e., (1) the high molecular weight butadiene/acrylonitrile copolymer, (2) the low molecular weight butadiene polymer, (3) the compatible ethylenically unsaturated compound, and (4) the free-radical generating system. For example, flowable compositions can be made by mixing them and other desired adjuvants in any order and, if desired, with the aid of a solvent such as chlorinated hydrocarbons, e.g., chloroform, chlorobenzene, trichloroethylene and chlorotoluene; ketones, e.g., methyl ethyl ketone, diethyl ketone and methyl isobutyl ketone; aromatic hydrocarbons, e.g., benzene, toluene and xylene; and tetrahydrofuran. The above solvents can contain as diluents acetone; lower molecular weight alcohols, e.g., methyl, ethyl and propyl alcohol; and esters, e.g., methyl, ethyl and butyl acetate. The solvent can be removed later by heating the admixture or extruded layer.

Conventional milling, mixing, and solution techniques can be used in making these compositions, the particular technique varying with the differences in properties of the respective components. The homogeneous, essentially non-radiation-scattering compositions, are formed into sheets in any desired manner. For example, solvent-casting, hot pressing, calendering, or extrusion are suitable methods for preparing layers of the desired thickness.

The photosensitive elements of this invention can be made by solvent casting or by extruding, calendering or pressing at an elevated temperature of the photosensitive composition into the form of a layer or self-supporting sheet on a suitable casting wheel, belt or platen. The layer or sheet may be laminated to the surface of a suitable permanent substrate or, if necessary, it may be affixed by means of a suitable adhesive, or the solution may be coated directly onto a suitable substrate. The photosensitive elements may have antihalation material beneath the photosensitive layer. For instance, the substrate may contain an antihalation material or have a layer or stratum of such material on its surface. The elements may be made in the various manners described in U.S. Pat. Nos. 2,760,863, 2,791,504 and 3,024,180. The photosensitive layer itself can serve as the light absorption layer, e.g., when dyes or pigments are included in the photosensitive composition or when the layer is sufficiently thick.

The thickness of the photosensitive layer is a direct function of the thickness desired in the relief image and this will depend on the subject being reproduced and the ultimate use of the relief, e.g., thick soft reliefs are useful for flexographic printing and thin hard reliefs are useful for planographic printing. In general, the thickness of the polymerizable layer will be less than about 250 mils, e.g., it will vary from about 0.5 to about 250 mils (0.00127–0.635 cm) and layers within this range of thickness will be used for the majority of the printing plates.

The photosensitive compositions described herein may be applied to a wide variety of substrates. By "substrate" is meant any natural or synthetic support, especially one which is capable of existing in a flexible or rigid film or sheet form. Suitable substrates include metals, e.g., steel and aluminum plates, sheets and foils, cellulose paper, fiberboard, and films or plates composed of various film-forming synthetic resins or high polymers, such as the addition polymers and in particular vinylidene chloride copolymers with vinyl chloride, vinyl acetate, styrene, isobutylene and acrylonitrile; vinyl chloride homopolymers and copolymers with vinyl acetate, styrene, isobutylene and acrylonitrile; linear condensation polymers such as polyesters, e.g., polyethylene terephthalate; polyamides, e.g., polyhexamethylenesebacamide; polyimides, e.g., films as disclosed in U.S. Pat. No. 3,179,634; and polyester amides, e.g., polyhexamethyleneadipamide adipate and the like, or a composite of two or more of these materials. Fillers or reinforcing agents can be present in the synthetic resin or polymer bases such as the various fibers (synthetic, modified, or natural), e.g., cellulosic fibers, for nstance, cotton, cellulose acetate, viscose rayon; paper; glass wool; nylon and polyethylene terephthalate. These reinforced bases may be used in laminated form. Other substrates include copper, alumina-blasted aluminum, oriented polyester film, alumina-blasted oriented polyester film, polyvinylidene chloride-coated oriented polyester film, polyvinyl alcohol-coated paper, crosslinked polyester-coated paper, nylon, glass, heavy paper such as lithographic paper, polypropylene film, silicon wafers, and the like. Various anchor layers disclosed in U.S. Pat. No. 2,760,863 can be used to give strong adherence between the substrate and the photosensitive layer or, in the case of a transparent substrate, preexposure through the substrate to actinic radiation may be useful. The adhesive compositions disclosed in U.S. Pat. No. 3,036,913 are also effective.

When highly reflective substrates are used, oblique rays passing through clear areas in the process transparency will strike the surface of the base at an angle other than 90°, and after reflection they will cause polymerization in the nonimage areas. This disadvantage can be overcome when the photosensitive layer is on a radiation-reflective substrates by an intervening stratum sufficiently absorptive of actinic radiation so that less than 35% of the incident radiation is reflected. The layer absorptive of reflected radiation or nonradiation scattering layer, or antihalation layer, can be made by dispersing a finely-divided dye or pigment which substantially absorbs actinic radiation in a solution or aqueous dispersion of a resin or polymer which is adherent to both the substrate and the photoinsolubilized image and coating it on the substrate to form an anchor layer which is dried. Suitable antihalation pigments include carbon black, manganese dioxide, dyes, e.g., Acid Blue Black (CI 20470) and Acid Magenta O (CI 42685). A dyed metal plate is also useful.

The antihalation layer intermediate between the photosensitive layer and the substrate when used must have adequate adhesion to the substrate and the photosensitive layer and not react with the radiation-absorptive material. Suitable polymeric or resin carriers for the radiation-absorptive dyes or pigments which can be used include polymers of vinyl compounds, e.g., polyvinyl chloride homopolymers, and copolymers, e.g., vinyl chloride with vinyl acetate, diethyl fumarate or ethyl acrylate. Copolymers of acrylic and methacrylic acid may also be used.

The photosensitive compositions are, in general, solids. They are also, frequently, depending on their composition, somewhat tacky on the surface. This latter property is of advantage in that compositions adhere of themselves to a substrate being used and do not usually require the application of an adhesive to retain them on the substrate, both during photoexposure and development steps and during subsequent use of the insolubilized material as a printing plate. The elements of the invention may be provided with a transparent flexible cover sheet such as a thin film of polystyrene, polyethylene, polypropylene, polyethylene terephthalate or other strippable material on the side of the photosensitive layer remote from the substrate to prevent contamination of or damage to the photosensitive layer during storage or manipulation. The elements may also be provided with a thin, hard, flexible, solvent-soluble layer, such as a flexible, polymeric film or layer, e.g., of a polyamide or a copolymer of ethylene and vinyl acetate, or the known type of mold-release agents, e.g., certain commercially available silicones, which is interposed between the cover sheet, when present, and the upper surface of the photosensitive layer when it is desired to protect for reuse an image-bearing negative or transparency superposed thereon or to improve contact or alignment with the photosensitive surface. If desired, the photosensitive element can also have on the reverse surface of the substrate a pressure-sensitive adhesive layer provided with a protective strippable layer. Upon removal of the latter, the element can be processed onto or otherwise adhered to a permanent substrate, e.g., a printing block or metal plate.

Printing reliefs can be made in accordance with this invention by exposing to actinic radiation selected portions of a photosensitive layer of an element described above, for example, through a process transparency, i.e., an image-bearing transparency or stencil having areas essentially transparent to actinic radiation and of substantially uniform optical density and areas opaque to actinic radiation and of substantially uniform optical density until substantial addition-polymerization or photocross-linking takes place. During the addition-polymerization or cross-linking, the butadiene polymer/ethylenically unsaturated compound composition is converted to the insoluble state in the radiation-exposed portions of the layer, with no significant polymerization or cross-linking taking place in the unexposed portions or areas of the layer. The unexposed portions of the layer are removed by means of a solvent for the high and low molecular weight butadiene polymers. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photopolymerizable layer underneath the clear portions of the transparency. This results in a polymeric relief having its greatest width at the bottom of the photopolymerizable layer, i.e., a frustum, the top surface of the relief being the dimensions of the clear area.

Inasmuch as the free-radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, electron flash units and photographic flood lamps. Electron accelerators and electron beam sources through an appropriate mask may also be used. Of these, the mercury-vapor lamps, particularly the sun lamp or "black light" type, and the fluorescent sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc or a sunlamp is used at a distance of about 1.5 to about 60 inches (3.8–153 cm) from the photosensitive composition. Exposure temperatures are not particularly critical, but it is preferred to operate at about ambient temperatures or slightly higher, i.e., about 20° to about 35° C.

After exposure, the image may be developed by washing with a suitable solvent. The solvent liquid should have good solvent or swelling action on the butadiene polymer/ethylenically unsaturated compound composition and little action on the insolubilized image or upon the substrate material, antihalation layer, or anchor layer, in the period required to remove the nonpolymerized or noncross-linked portions. Suitable organic solvents include 2-butanone, benzene, toluene, xylene, trichloroethane, trichloroethylene, methyl chloroform, tetrachloroethylene, and solvent mixtures, e.g., tetrachloroethylene/n-butanol, which is preferred. When one or both of the high and low molecular weight butadiene polymer components contain carboxyl groups, suitable solvents include aqueous base to which a water-soluble organic solvent may be added. Suitable specific solvent mixtures include sodium hydroxide/isopropyl alcohol/water, sodium carbonate/water, sodium carbonate/2-butoxyethanol/water, sodium borate/2-butoxyethanol/water, sodium silicate/2-butoxyethanol/glycerol/water, and sodium carbonate/2-(2-butoxyethoxy)ethanol/water. The particular solvent combination chosen will depend upon the carboxyl-content of the photosensitive composition and the properties and amounts of the binders employed. Other aqueous solvent combinations which may be employed are described in U.S. Pat. No. 3,796,602. These aqueous base/water-soluble organic solvent combinations may be preferred in some cases because of their low cost, nonflammability and reduced toxicity.

Solvent development may be carried out at about 25° C., but best results are sometimes obtained when the solvent is warm, e.g., 30°–60° C. Development time can be varied but preferably is in the range of 5–25 minutes.

In the development step where the relief is formed, the solvent may be applied in any convenient manner, as by pouring, immersion, spraying, or roller application. Brushing aids in the removal of the unpolymerized or uncross-linked portions of the composition.

Alternatively, depending upon application, development of the image after exposure may be carried out by toning, i.e., dusting with a fine pigment which selectively adheres to the tacky unpolymerized areas.

The printing reliefs made in accordance with this invention can be used in all classes of printing, but are most applicable to those classes of printing wherein a distinct difference of height between printing and nonprinting areas is required, and particularly to the flexographic printing class wherein a resilient print area is required, e.g., for printing on deformable printing surfaces. These classes include those wherein the ink is carried by the raised portion of the relief such as in dry-offset printing, ordinary letterpress printing, the latter requiring greater height differences between printing and nonprinting areas, and those wherein the ink is carried by the recessed portions of the relief such as in gravure and intaglio printing, e.g., line and inverted half-tone. The plates are also useful for multicolor printing.

The photosensitive compositions of this invention are also useful in the preparation of photoresists for etching, gravure, planograph plates, semiconductor wafers, and screens for "silk screen" printing or as stencils. The compositions can be coated onto printing cylinders, e.g., plastic or metal cylinders, or attached thereon as photosensitive elastomeric layers.

The photosensitive compositions are suitable for other purposes, in addition to the printing uses described above, in which readily insolubilized, solid, addition polymerizable compositions are useful, e.g., for making ornamental plaques or for producing ornamental effects; for making patterns for automatic engraving machines, foundry molds, cutting and stamping dyes; for name stamps; for relief maps; for gaskets; as rapid cure coatings, e.g., on film base, on rollers, inside tanks; in the preparation of printed and microelectronic circuits; for affixing phosphors to surfaces to provide color television screens; and in the preparation of other plastic or elastomeric articles.

EXAMPLES OF THE INVENTION

The following examples are illustrative of the invention. All parts and percentages are by weight and all degrees are Celsius unless otherwise stated.

The photosensitive compositions were generally prepared by mixing the ingredients under yellow light on a rubber mill at 100°–120°. The order of mixing was generally as follows:

(1) high molecular weight copolymer binder;

(2) other inert components including the low molecular weight butadiene polymer;

(3) ethylenically unsaturated compound and free-radical generating system; these components were ordinarily premixed.

The photosensitive elements were prepared by pressing the milled compositions, supported on a 5-mil (0.0127 cm) vinylidene chloride/vinyl chloride copolymer-subbed, oriented polyester film substrate, at 100°–120° and 15,000–20,000 psi using 65-mil (0.165 cm) metal shims to control plate thickness. A polytetrafluoroethylene cover sheet was employed. A Pasadena press was employed for preparation of the plates. The polytetrafluoroethylene cover sheet was replaced with a 1-mil (0.00254 cm) thick film of polypropylene before exposure.

Samples were exposed in a glass vacuum frame (nuArc Co.) at 250 mm mercury pressure to a Black Lite Eastern (BLE) Spectroline exposure source, Model XX15 (0.76 amp), containing two 15 w lamps (G.E. F15T8-BL) held 2 in (5.1 cm) from the sample, unless otherwise specified. A sheet of standard antihalation material was placed on the underside of the samples during exposure. Standard negative resolution targets were used as process transparencies in contact with the photosensitive compositions. After exposure, the polypropylene cover sheet was removed and the images were developed by gently hand-brushing the surfaces with a bristle brush in the development solvent. Development times were generally 10–15 minutes at temperatures of 25°–60°. After development, the plates were air-dried at 55°, post-exposed in air, and assessed for properties.

EXAMPLE 1

The following photosensitive composition was blended by milling at 120° following the general procedure described above:

27.5 g of Hycar® 1072-CG high molecular weight copolymer 17.5 g of Hycar® CTBNX (1300×9) low molecular weight copolymer 4.0 g of Hycar ® VTBNX (1300×19) low molecular weight copolymer and monomer 1.0 g of benzoin isobutyl ether Hycar ® 1072-CG (B. F. Goodrich Chemical Co.) is a high molecular weight (average Mooney Viscosity=45; $\overline{M}n \sim 30,000$) carboxylated butadiene/acrylonitrile copolymer (~27% acrylonitrile content; carboxyl content, ~3.38% based on an EPHR value of 0.075).

Hycar ® CTBNX (1300×9) (B. F. Goodrich Chemical Co.) is a low molecular weight ($\overline{M}n \sim 3,400$) liquid butadiene/acrylonitrile copolymer (~18% acrylonitrile content) containing pendant and terminal carboxyl groups (EPHR=0.072; 3.24% carboxyl content).

Hycar ® VTBNX (1300×19) (B. F. Goodrich Chemical Co.) is a low molecular weight (Brookfield Viscosity=490,000 cps at 27°; $\overline{M}n \sim 3,000$–4,000) liquid butadiene/acrylonitrile copolymer (~16–17% acrylonitrile) containing pendant and terminal vinyl groups (EPHR vinyl group content=0.07).

After milling, the slab was pressed into a plate at 110°/15,000 psi by the general procedure described. The plate was exposed to radiation for 20 minutes through a line process negative, and the exposed image was developed by hand-brushing it for 10 minutes at room temperature in a solution of 0.5% sodium hydroxide in water/isopropyl alcohol (3/1 v/v). A 10-mil (0.0254 cm) relief image was obtained corresponding to the transparent areas of the process transparency. Further development at ~60° for 7–8 minutes resulted in additional development and the formation of a 28-mil (0.071 cm) relief image. The clear, elastic plate, after drying and postexposure (1.5 hrs), was characterized by good softness, resilience, and excellent image sharpness in the raised relief areas. It could be bent through a 180° angle without cracking of the image.

EXAMPLE 2

The following photosensitive composition was blended by milling at 100° following the general procedure:

27.5 g of Hycar ® 1072-CG, Example 1

15.0 g of Hycar ® CTBNX (1300×9), Example 1

6.5 g of the 1:1 adduct of hydroxyethyl acrylate (HEA) and itaconic anhydride (ITA)

1.0 g of benzoin isobutyl ether

The unsaturated adduct was prepared by mixing 3.31 g of hydroxyethyl acrylate and 3.19 g of finely powdered itaconic anhydride followed by heating at 90° for 1.5 hr under a nitrogen atmosphere. The viscous liquid adduct was mixed with the benzoin isobutyl ether prior to milling.

Plates were pressed from the slab at 120°/15,000 psi, and they were exposed to radiation imagewise in the usual way for 20 minutes through line process negatives. For each plate, the exposed image was developed by hand-brushing with the development solution described in Table I, first at room temperature, and finally under the conditions described in Table I to obtain the relief described in Table I. The plates, after drying and postexposure (1.0 hr), showed the softness, resilience, image sharpness and flexibility described for the plate of Example 1.

TABLE I

| Sample | Development Solution | Development Conditions | Relief, mils |
|---|---|---|---|
| A | 0.5% sodium hydroxide in water/isopropyl alcohol (1/1 v/v) | 50° (10 min) | 30 |
| B | 0.8% sodium carbonate in 2-(2-butoxyethoxy)-ethanol/water (1/4 w/w) | 55° (10 min) | 34 |
| C | 0.8% sodium carbonate in 2-(2-butoxyethoxy)-ethanol/water (1/9 w/w) | 55° (10 min) | 26 |
| D | 1.0% aqueous sodium carbonate containing 1 drop/400 ml Igepal ® wetting agent | 55° (10 min) | 11 |

EXAMPLE 3

This Example illustrates the use of a water-soluble, ethylenically unsaturated compound. The following photosensitive composition was blended by milling following the general procedure:

30.0 g of Hycar ® 1072-CG, Example 1

12.0 g of Hycar ® CTBNX (1300×9), Example 1

7.0 g of polyoxyethylated trimethylolpropane triacrylate (molecular weight of 1162)

1.0 g of benzoin isobutyl ether

A plate was pressed from the slab by the general procedure described, and it was exposed to radiation image-wise in the usual way for 20 minutes. The exposed plate was tested for developability in a solution of 0.8% sodium carbonate in 2-(2-butoxyethoxy) ethanol/water (1/4). A relief image (ca 5 mils) was obtained after hand-brushing the surface with a bristle brush for 10 min at room temperature. Further development for 10 min at 55° C. produced a 24-mil relief image. The plate, after drying and postexposure (1.0 hr), possessed physical property characteristics as described for the plate of Example 1.

EXAMPLES 4–6

Following the general procedure, photosensitive compositions which included the ethylenically unsaturated compound specified in Table II were blended by milling, as follows:

60 parts of Hycar ® 1072-CG, Example 1

20 parts of Hycar ® CTBNX (1300×9), Example 1

18 parts of ethylenically unsaturated compound 2 parts of benzoin isobutyl ether Plates were pressed from the slabs at 110°/20,000 psi, and the plates were exposed to radiation from a bank of four ultraviolet lamps (Sylvania blacklite very high output lamps, FR-48T12-B1-VHO-180, 48 w) at a distance of 6 in (15.2 cm) using the following procedure: (1) the back of the plate was first exposed through the substrate for 6 sec in air (backflash); (2) the top of the plate was exposed for 7 min in vacuo through a Stouffer $\sqrt{2}$ stepwedge process transparency, in which the transmittance of radiation between steps differs by a factor of $\sqrt{2}$; (3) the top of the plate was postexposed in air for 10–15 minutes, after development and drying in the usual way.

The plates were developed by hand-brushing at 55° for 10 min in a solution of 0.8% sodium carbonate in 2-(2-butoxyethoxy) ethanol/water (1/9). The plates showed imaging of 11–12 steps of the process transparency, and they possessed physical properties similar to those of the plate of Example 1. Relief was measured on plates which were exposed to radiation as described for the plate of Example 1 with a post-exposure of 1.0 hr. Hardness was measured on plates exposed as described for these examples except that no process transparency was used in step (2).

TABLE II

| Ex. | Ethylenically Unsaturated Compound | Relief, mils | Shore A Hardness |
|---|---|---|---|
| 4 | Epocryl ® 12[1] | 26 | 78–82 |
| 5 | ITA/Epocryl ® 12 Adduct[2] | 25 | 68–72 |
| 6 | 1:1 HEA/ITA | 20 | 59–61 |

[1]Epocryl ® 12 is the dimethacrylate ester of a polyhydroxy polyether epoxy resin. It is commercially available from the Shell Development Co.
[2]The compound was prepared by reaction of 12.32 parts of Epocryl ® 12 with 5.68 parts of itaconic anhydride (ITA) at 75° for 1.5 hrs under nitrogen.

Comparable relief images were obtained from the plates of Examples 4–6 when they were developed in tetrachloroethylene/n-butanol solution (3/1, v/v) at room temperature in an automatic processor, as summarized in Table III. Radiation exposure in step (2) above was for 8 min.

TABLE III

| Example | Development Time, min. | Relief, mils |
|---|---|---|
| 4 | 6.5 | 22 |
| 5 | 6.5 | 23 |
| 6 | 8.0 | 29 |

EXAMPLES 7–13

Following the general procedure, photosensitive compositions which included the ethylenically unsaturated compound specified in Table IV were blended by milling, as follows:
 65 parts of Hycar ® 1072-CG, Example 1
 20 parts of Hycar ® CTBNX (1300×9), Example 1
 13 parts of ethylenically unsaturated compound
 2 parts of benzoin isobutyl ether Plates were pressed from the slabs, and the plates were exposed to radiation as described for Examples 4–6. The plates were developed by hand-brushing at 55° for 15 minutes in a solution of 0.8% sodium carbonate in 2-(2-butoxyethoxy)ethanol/water (1/9). The postexposure times were 15 minutes. Relief was measured on plates which were exposed to radiation as described for the plate of Example 1 for 30 minutes with a post-exposure of 1.0 hr. Hardness was measured on plates exposed as described for these examples except that no process transparency was used in step (2). The results are summarized in Table IV. The developed plates possessed physical properties similar to those of the plate of Example 1.

TABLE IV

| Ex. | Ethylenically Unsaturated Compound | Relief, mils | Shore A Hardness |
|---|---|---|---|
| 7 | Polyoxyethylated trimetholylpropane triacrylate | 22.0 | 51 |
| 8 | Poly(ethylene glycol) diacrylate | 15.4 | 57 |
| 9 | Ethylene glycol acrylate phthalate | 21.0 | 56 |
| 10 | 6.5 parts ethylene glycol acrylate phthalate + 6.5 parts Hycar ® VTBNX (1300 × 19) | 24.0 | 52–53 |
| 11 | 6.5 parts ethylene glycol acrylate phthalate + 6.5 parts polyoxyethylated trimethylolpropane triacrylate | | |
| 12 | 6.5 parts ethylene glycol acrylate phthalate + 6.5 parts poly(ethylene glycol) diacrylate | 21.0 | 57 |
| 13 | Triethylene glycol diacrylate | 22.0 | 58 |
| 13A[1] | Triethylene glycol diacrylate | 18.0 | — |

[1]A development time of 12 minutes was employed.

EXAMPLES 14–16

Following the general procedure, photosensitive compositions which included the liquid, low molecular weight, carboxylated butadiene/acrylonitrile copolymer specified in Table V were blended by milling, as follows:
 65 parts of Hycar ® 1072-CG, Example 1
 20 parts of low molecular weight, carboxylated, butadiene/acrylonitrile copolymer
 13 parts of triethylene glycol diacrylate
 2 parts of benzoin isobutyl ether Plates were pressed from the slabs, and the plates were exposed to radiation as described for Examples 4–6. The plates were developed by hand-brushing at 55° for 12 minutes in a solution of 0.8% sodium carbonate in 2-(2-butoxyethoxy)ethanol/water (1/9). The postexposure times were 15 minutes. Relief was measured on plates which were exposed to radiation as described for the plate of Example 1 for 30 minutes with a post-exposure of 1.0 hr. Hardness was measured on plates exposed as described for these examples except that no process transparency was used in step (2). The results are summarized in Table V. The developed plates possessed physical properties similar to those of the plate of Example 1.

TABLE V

| Ex. | Butadiene-Acrylonitrile Copolymer[1] | Relief, mils | Shore A Hardness |
|---|---|---|---|
| 14 | Hycar ® CTBN (1300 × 15) | 16 | 59–60 |
| 15 | Hycar ® CTBN (1300 × 8) | 17 | 59 |
| 16 | Hycar ® CTBN (1300 × 13) | 17 | 56–57 |

[1]The Hycar ® CTBN polymers used are similar in composition to Hycar ® CTBNX (1300 × 9) described in Example 1. They have the following properties:
1300 × 15:
Mn ~ 3600; ~ 10% acrylonitrile content; EPHR = 0.051 (2.30% carboxyl content).
1300 × 8:
Mn ~ 3400; ~ 18% acrylonitrile content; EPHR = 0.055 (2.48% carboxyl content).
1300 × 13:
Mn ~ 3400; ~ 28% acrylonitrile content; EPHR = 0.055 (2.48% carboxyl content).

EXAMPLE 17

Following the general procedure, the following photosensitive composition was blended by milling at 60°:
 136 g of Hycar ® 1032-45 high molecular weight copolymer
 30 g of Hycar ® VTBNX, Example 1
 30 g of triethylene glycol diacrylate 4 g of benzoin isobutyl ether 0.060 g of 1,4,4-trimethyl-2,3-diazabicyclo-[3.2.2]non-2-ene-N,N'-dioxide thermal inhibitor source Hycar ® 1032-45 (B. F. Goodrich Chemical Co.) is a high molecular weight (average Mooney Viscosity=45; $\overline{Mn}$=29,000) butadiene/acrylonitrile copolymer (~33% acrylonitrile content).

Plates prepared from the slabs were exposed to radiation as follows:

(1) Each plate was exposed through the substrate (back-flashed) for 1.0 minute at a distance of 2 inches (5.1 cm) from an array of eight closely spaced 20 watt Westinghouse sunlamps (FS-20), which served to form a polymerized floor and to photocondition the remainder of the photopolymerizable layer.

(2) The top of each plate was exposed for 8.0 minutes under vacuum in a vacuum frame through the usual $\sqrt{2}$ stepwedge process transparency and a 15 dot target. The lamp array used was that described for Examples 4-6 except that eight lamps were employed.

The exposed plates were developed for 14 minutes in a solvent mixture of 3/1 tetrachloroethylene/n-butanol in a commercial processor (Cyrel ® Plate Processor; Model No. 2-1824; Du Pont Company). Following development the plates were dried for 10 minutes at 45° in a circulating air oven, further dried at 25° for 24 hours, and finally postexposed for 10 minutes in air with the lamp array used for the second exposure above.

Relief, 24 mils

Shore A hardness, 64

EXAMPLE 18

Following the general procedure, the following photosensitive composition was blended by milling at 60°:

136 g Hycar ® 1032-45, Example 17
35 g of Hycar ® VTBNX, Example 1
25 g of hexamethylene glycol diacrylate
4 g of benzoin isobutyl ether
0.060 g of 1,4,4-trimethyl-2,3-diazabicyclo-[3.2.2]non-2-ene-N,N'-dioxide thermal inhibitor source Plates prepared from the slabs were exposed to radiation and developed as described in Example 17.

Relief, 28.5 mils

Shore A hardness, 70

EXAMPLE 19

This example illustrates the use of a low molecular weight butadiene polymer containing no nitrile groups. The following photosensitive composition was blended at 80° by milling, following the general procedure:

68 parts of Hycar ® 1072-CG, Example 1
15 parts of Hycar ® CTB (2000×162) low molecular weight polymer
15 parts of trimethylolpropane triacrylate
2 parts of benzoin isobutyl ether Hycar ® CTB (2000×162) (B. F. Goodrich Chemical Co.) is a low molecular weight ($\overline{Mn}$~4,000) liquid butadiene polymer (0% acrylonitrile) terminated with carboxyl groups (EPHR=0.045; 2.03% carboxyl content).

Plates were pressed from the slab by the general procedure described, and the plates were exposed to radiation as described for Examples 4-6. The plates were developed for 20 minutes in a solution of 0.8% sodium carbonate in 2-(2-butoxyethoxy)ethanol/water (1/9) in a prototype of the commerical processor described in Example 17. Relief was measured on a plate which was exposed to radiation as described for the plate of Example 1 for 30 minutes with a post-exposure of 1.0 hr. Hardness was measured on a plate exposed as described for this example except that no process transparency was used in step (2).

Relief, 9.3 mils

Shore A hardness, 70

EXAMPLE 20-23

These examples illustrate the use of high molecular weight butadiene/acrylonitrile copolymers of varying carboxyl and acrylonitrile content. Following the general procedure, photosensitive compositions which included the appropriate high molecular weight butadiene/acrylonitrile copolymer of Table VI were blended by milling at 100°, as follows:

60 parts of high molecular weight copolymer (Table VI)
20 parts of Hycar ® CTBNX (1300×9), Example 1
18 parts of triethylene glycol diacrylate
2 parts of benzoin isobutyl ether.

Plates were pressed from the slabs by the general procedure described, and the plates were exposed to radiation as described for Examples 4-6. The plates were developed for 20 minutes in a solution of 0.8% sodium carbonate in 2-(2-butoxyethoxy)ethanol/water (1/9) in a prototype of the commercial processor described in Example 17. Results are summarized in Table VI. Post-exposure times were 15 minutes. Relief was measured on plates which were exposed to radiation as described for the plate of Example 1 for 30 minutes with a post-exposure of 1.0 hr. Hardness was measured on plates exposed as described for these examples except that no process transparency was used in step (2). The developed plates possessed physical properties similar to those of the plate of Example 1.

TABLE VI

| Example | High Molecular Wt. Copolymer | Relief, mils | Shore A Hardness |
|---------|------------------------------|--------------|------------------|
| 20 | Hycar ® 1072-CG | 20 | 64 |
| 21 | Krynac ® 110C | 2.6 | 66 |
| 22 | Krynac ® 211 | 24.6 | 66 |
| 23 | Tylac ® 68-064 crumb | 9.9 | 66 |

The high molecular weight copolymers of Examples 21-23 are similar in composition to Hycar ® 1072-CG (Example 1), but they have varying carboxyl contents as follows:

Krynac ® 110C (Polysar, Inc.): Mooney Viscosity=50; $\overline{Mn}$=~30,000; acrylontirile content,~31-34% carboxyl content,~1%.

Krynac ® 211 (Polysar Inc.): Mooney Viscosity=55; acrylonitrile content,~31-34%; carboxyl content,~4.5%.

Tylac ® 68-064 crumb was prepared by coagulating Tylac ® 68-064 Latex Polymer Emulsion (Reichhold Chemicals, Inc.: acrylonitrile content,~40%; carboxyl content,~6%) by slowly pouring it into an agitated 7.5% aqueous sodium chloride solution. The crumb was washed with distilled water in a blender and dried to a constant weight at 40°-50° in vacuum before use.

EXAMPLE 24

This example illustrates the use of a low molecular weight butadiene/acrylonitrile copolymer without carboxyl groups. The following photosensitive composition was blended at 100° by milling following the general procedure:

65 parts of Hycar ® 1072-CG, Example 1
15 parts of Hycar ® 1312 low molecular weight copolymer
18 parts of triethylene glycol dimethacrylate
2 parts of benzoin isobutyl ether.

Hycar ® 1312 (B. F. Goodrich Chemical Co.) is a low molecular weight [Brookfield Viscosity (no. 4 spindle)=100,000 cps at 30°; $\overline{M}n=1200$] liquid butadiene/acrylonitrile copolymer (33% acrylonitrile content).

Plates were pressed from the slab by the general procedure described, and the plates were exposed to radiation as described for Example 4–6. The plates were developed for 20 minutes in a solution of 0.8% sodium carbonate in 2-(2-butoxyethoxy)ethanol/water (1/9) is a prototype of the commercial processor described in Example 17. Relief was measured on a plate which was exposed to radiation as described for the plate of Example 1 for 30 minutes with a post-exposure of 1.0 hr. Hardness was measured on a plate exposed as described above except that no process transparency was used in step (2).

Relief, 22 mils
Shore A hardness, 56

EXAMPLE 25

This example illustrates the use of benzil dimethyl acetal as the free-radical generating compound. The following photosensitive composition was blended at 100° by milling following the general procedure:

61 parts of Hycar ® 1072-CG, Example 1
20 parts of Hycar ® CTBNX (1300×9), Example 1
18 parts of 1,6-hexamethylene glycol diacrylate
1 parts of benzil dimethyl acetal Plates were pressed from the slab by the general procedure described, and the plates were exposed to radiation as described in Examples 4–6. The plates were developed for 20 minutes in a solution of 0.8% sodium carbonate in 2-(2-butoxyethoxy)ethanol/water (1/9) in a prototype of the commercial processor described in Example 17. Relief was measured on a plate which was exposed to radiation as described for the plate of Example 1, for 30 minutes with a post-exposure of 1.0 hr. Hardness was measured on a plate exposed as described for this example except that no process transparency was used in step (2).

Relief, 19.0 mils
Shore A hardness, 53

I claim:

1. A photosensitive, elastomeric composition which comprises, based on the total composition,
   (a) 55 to 85% by weight of a high molecular weight butadiene/acrylonitrile copolymer having a number average molecular weight of 20,000 to 75,000, an acrylonitrile content of 10 to 50% by weight, and a carboxyl content of 1 to 15% by weight;
   (b) 5 to 40% by weight of a low molecular weight butadiene polymer having a number average molecular weight of 750 to 10,000, an acrylonitrile content of 0 to 50% by weight, and a carboxyl content of 0 to 15% by weight, with the proviso that the combination of the high molecular weight butadiene/acrylonitrile copolymer and the low molecular weight butadiene polymer contains at least 2% by weight of carboxyl groups;
   (c) 2 to 40% by weight of a nongaseous, ethylenically unsaturated compound containing at least one terminal ethylenic group, said compound being capable of forming a high polymer by free-radical initiated, chain-propagating addition polymerization and being compatible with polymers (a) and (b); and
   (d) 0.001 to 10% by weight of an organic, radiation-sensitive, free-radical generating system, activatable by actinic radiation which initiates polymerization of the unsaturated compound.

2. The photosensitive, elastomeric composition of claim 1 in which high molecular weight copolymer (a) and low molecular weight polymer (b) both have a carboxyl content of 2 to 10%.

3. The photosensitive, elastomeric composition of claim 1 in which high molecular weight copolymer (a) is present in the amount of 60 to 75%, and low molecular weight polymer (b) is present in the amount of 10 to 35%.

4. The photosensitive, elastomeric composition of claim 3 in which high molecular weight copolymer (a) has a molecular weight of 25,000 to 50,000 and an acrylonitirle content of 15 to 40%.

5. The photosensitive, elastomeric composition of claim 4 in which high molecular weight copolymer (a) has a carboxyl content of 2 to 10%.

6. The photosensitive, elastomeric composition of claim 3 in which low molecular weight polymer (b) has a molecular weight of 1000 to 5000 and an acrylonitrile content of 10 to 30%.

7. The photosensitive, elastomeric composition of claim 6 in which low molecular weight polymer (b) has a carboxyl content of 2 to 10%.

8. The photosensitive, elastomeric composition of claim 2 in which high molecular weight copolymer (a) is present in the amount of 60 to 75%, and has a molecular weight of 25,000 to 50,000 and an acrylonitrile content of 15 to 40%, and low molecular weight polymer (b) is present in the amount of 10 to 35%, and has a molecular weight of 1000 to 5000 and an acrylonitrile content of 10 to 30%.

9. The photosensitive, elastomeric composition of claim 3 in which high molecular weight copolymer (a) has a molecular weight of 25,000 to 50,000 and an acrylonitrile content of 15 to 40%, and low molecular weight polymer (b) has a molecular weight of 1000 to 5000 and an acrylonitrile content of 10 to 30%.

10. A photosensitive flexographic plate which comprises a substrate having thereon a layer of the photosensitive, elastomeric composition of claim 1 having a thickness of 0.5 to 250 mils.

11. The flexographic plate of claim 10 in which high molecular weight copolymer (a) and low molecular weight polymer (b) both have a carboxyl content of 2 to 10%.

12. The flexographic plate of claim 10 in which high molecular weight copolymer (a) is present in the amount of 60 to 75%, and low molecular weight polymer (b) is present in the amount of 10 to 35%.

13. The flexographic plate of claim 12 in which high molecular weight copolymer (a) has a molecular weight of 25,000 to 50,000 and an acrylonitrile content of 15 to 40%.

14. The flexographic plate of claim 13 in which high molecular weight copolymer (a) has a carboxyl content of 2 to 10%.

15. The flexographic plate of claim 12 in which low molecular weight polymer (b) has a molecular weight of 1000 to 5000 and an acrylonitrile content of 10 to 30%.

16. The flexographic plate of claim 15 in which low molecular weight polymer (b) has a carboxyl content of 2 to 10%.

17. The flexographic plate of claim 11 in which high molecular weight copolymer (a) is present in the amount of 60 to 75%, and has a molecular weight of 25,000 to 50,000 and an acrylonitrile content of 15 to 40%, and low molecular weight polymer (b) is present in the amount of 10 to 35% and has a molecular weight of 1000 to 5000 and an acrylonitrile content of 10 to 30%.

18. The flexographic plate of claim 12 in which high molecular weight copolymer (a) has a molecular weight of 25,000 to 50,000 and an acrylonitrile content of 15 to 40%, and low molecular weight polymer (b) has a molecular weight of 1000 to 5000 and an acrylonitrile content of 10 to 30%.

* * * * *